United States Patent [19]
Almasi et al.

[11] 3,967,002
[45] June 29, 1976

[54] METHOD FOR MAKING HIGH DENSITY MAGNETIC BUBBLE DOMAIN SYSTEM

[75] Inventors: George S. Almasi, Katonah; Robert J. Hendel, Beacon; George E. Keefe, Montrose; Yeong S. Lin, Mt. Kisco; Richard P. McGouey, Mahopac, all of N.Y.

[73] Assignee: International Business Machines Corporation, Armonk, N.Y.

[22] Filed: Dec. 31, 1974

[21] Appl. No.: 537,797

[52] U.S. Cl............................... 427/132; 148/186; 340/174 TF; 427/259
[51] Int. Cl.²......................................... C04B 35/00
[58] Field of Search .......... 148/186, 187, 188, 189; 156/8, 13, 17; 340/174 TF, 174; 427/85, 88, 89, 128, 132, 259

[56] References Cited
UNITED STATES PATENTS

| | | | |
|---|---|---|---|
| 3,728,697 | 4/1973 | Heinz............................. | 340/174 TF |
| 3,792,452 | 2/1974 | Dixon et al. .................. | 340/174 TF |
| 3,828,329 | 8/1974 | Fischer et al. ................ | 340/174 TF |
| 3,873,373 | 3/1975 | Hill..................................... | 148/187 |
| 3,873,383 | 3/1975 | Kooi ..................:............... | 148/187 |

OTHER PUBLICATIONS
"Etching Copper Coated With Permalloy," A. Jones et al., IBM Tech. Dicl. Bull., vol. 15, No. 6, Nov. 1972, p. 2034.

*Primary Examiner*—Douglas J. Drummond
*Assistant Examiner*—Brian J. Leitten
*Attorney, Agent, or Firm*—Jackson E. Stanland

[57] ABSTRACT

A method for making a high density magnetic bubble domain system including the functions of read, write, storage, transfer, and annihilation. Only three masking steps are required, of which only one requires critical alignment. The proces makes use of the fact that magnetic disks can be placed on non ion implanted regions without adversely affecting the propagation properties of the implanted regions. Thus, the magnetic disks can be used to define ion implantation masks as well as for providing functions such as generation, propagation, reading, and annihilation. Magnetic elements for generation, storage and propagation, reading and annihilation are deposited in the same non-critical masking step, while all condutors used for writing, reading, and transfer are deposited by a single masking step requiring critical alignment.

26 Claims, 11 Drawing Figures

METHOD FOR MAKING HIGH DENSITY MAGNETIC BUBBLE DOMAIN SYSTEM

BACKGROUND OF THE INVENTION

1. Field of the Invention

This invention relates to an improved process for providing magnetic bubble domain systems, and in particular to a process for providing high density bubble domain systems using only a single critical masking step.

2. Description of the Prior Art

Various systems using magnetic bubble domains are known in the art. For example, a self-contained magnetic bubble domain memory chip using a decoder is shown in U.S. Pat. No. 3,701,125. Additionally, a major/minor loop memory configuration is shown in U.S. Pat. No. 3,618,054. As will be noted, provision of complete memory systems requires that some or all of the functions of read, write, propagation, transfer, and annihilation be provided. That is, bubble domains are generated for representation of information, and these bubble domains generally have to be propagated in the system. After propagation, they are read and then annihilated or returned to their storage locations. Additionally, these systems often require transfer functions where bubble domains are transferred from one propagation path to another, usually by the use of current carrying loops that produce magnetic field gradients for the transfer.

Many components are known in the art for generating magnetic bubble domains and for detecting these bubble domains. For example, a magnetoresistive sensing technique is shown in U.S. Pat. No. 3,691,540. For the function of storage, bubble domains are generally propagated using any of many well-known structures. In particular, high density structures are known using ion implanted regions in the bubble domain material for restraining and moving magnetic bubble domains, in combination with a reorienting magnetic field in the plane of the bubble domain material. Such ion implanted structures are described by R. Wolfe et al in the AIP Conference Proceedings, No. 10, Part 1, p. 339 (1973), which Proceedings contain the text of the papers delivered at the 18th Annual Conference on Magnetism and Magnetic Materials, held in Denver, Colo., in 1972.

The processes used for making magnetic bubble domain chips has developed through the years so that single level masking techniques are now used. In such techniques, the magnetic sensors are deposited using the same mask as is used for depositing the magnetic propagation elements. Additionally, since the propagation elements are not in contact with one another, conductors can be placed directly over the propagation elements without shorting any electrical currents. This means that the bubble domain chip can be fabricated using only a single critical masking step.

However, the prior art does not address the problem of making high density magnetic bubble domain chips where the propagation elements are contiguous with one another. In such systems, it is difficult to place conductors directly on the propagation elements, since electrical shorting may occur. Additionally, several critical masking steps are usually required in order to define the sensors, propagation elements, and conductors used for bubble domain transfer and sensor current. Because this is a critical problem when bubble domain technology is to be used to provide economical, high density structures, the present invention seeks to provide a process for providing such a high density magnetic bubble domain chip using a minimum number of masking steps, only one of which is critical.

Accordingly, it is a primary object of this invention to provide a process for fabricating high density magnetic bubble domain chips in which only one critical masking step is required.

It is another object of this invention to provide a process for fabricating a magnetic bubble domain chip having contiguous propagation elements requiring a minimum number of masking steps.

It is still another object of the present invention to provide a high density magnetic bubble domain chip having components for generation, reading, propagation, transfer, and annihilation, all of which components require a resolution less than $5d$, where $d$ is the bubble domain diameter.

It is a further object of this invention to provide an improved process for fabricating a high density magnetic bubble domain chip using ion implanted propagation elements, magnetic sensors and annihilators, and current carrying lines for generation, sensing, and transfer.

BRIEF SUMMARY OF THE INVENTION

The present invention utilizes the fact that a magnetic material, such as NiFe, can be present in combination with ion implanted propagation elements, without adversely affecting propagation due to the ion implanted elements. In more detail, it has been found that NiFe disks move bubbles in phase with the movement of bubbles by an ion implanted hole. Therefore, the present structure utilizes ion implanted regions in combination with magnetic elements to form a high density magnetic bubble domain structure where the propagation elements are the ion implanted regions, and the generators, sensors and annihilators are comprised of magnetic elements. The ion implanted propagation structures are tolerant of the magnetic elements which are placed throughout the magnetic chip.

These magnetic elements have a purpose in addition to that of providing generation and sensing. They serve as a plating base for an ion implantation mask used to define the ion implanted propagation elements. If the magnetic elements had an adverse effect on the propagation structure, an additional masking step would be required for provision of the magnetic elements in only the generation and sensing area of the magnetic chip. However, this is not necessary since they can be present in the generation area, in the sensing area, in the annihilation area and even in the propagation area, and can be placed there in a single non-critical masking step which is done early in the fabrication process.

In the fabrication process, a total of three masking steps is used. In the first masking step, the propagation paths, sensors, annihilators, and generators are defined. That is, this masking step defines the features to be provided by the magnetic elements (NiFe, for instance). This is a non-critical masking step.

The second masking step is also non-critical and is used to provide insulation for electrically insulating the sensors from conductors used in combination with the sensing technique.

The third masking step is a critical one which involves the alignment and formation of all necessary conductors. These conductors are used for bubble domain generation, bubble domain transfer, and bubble domain stretching/sensing.

These and other objects, features and advantages will be more apparent from the following more particular description of the preferred embodiments.

DETAILED DESCRIPTION OF THE PREFERRED EMBODIMENTS

Figure 1:
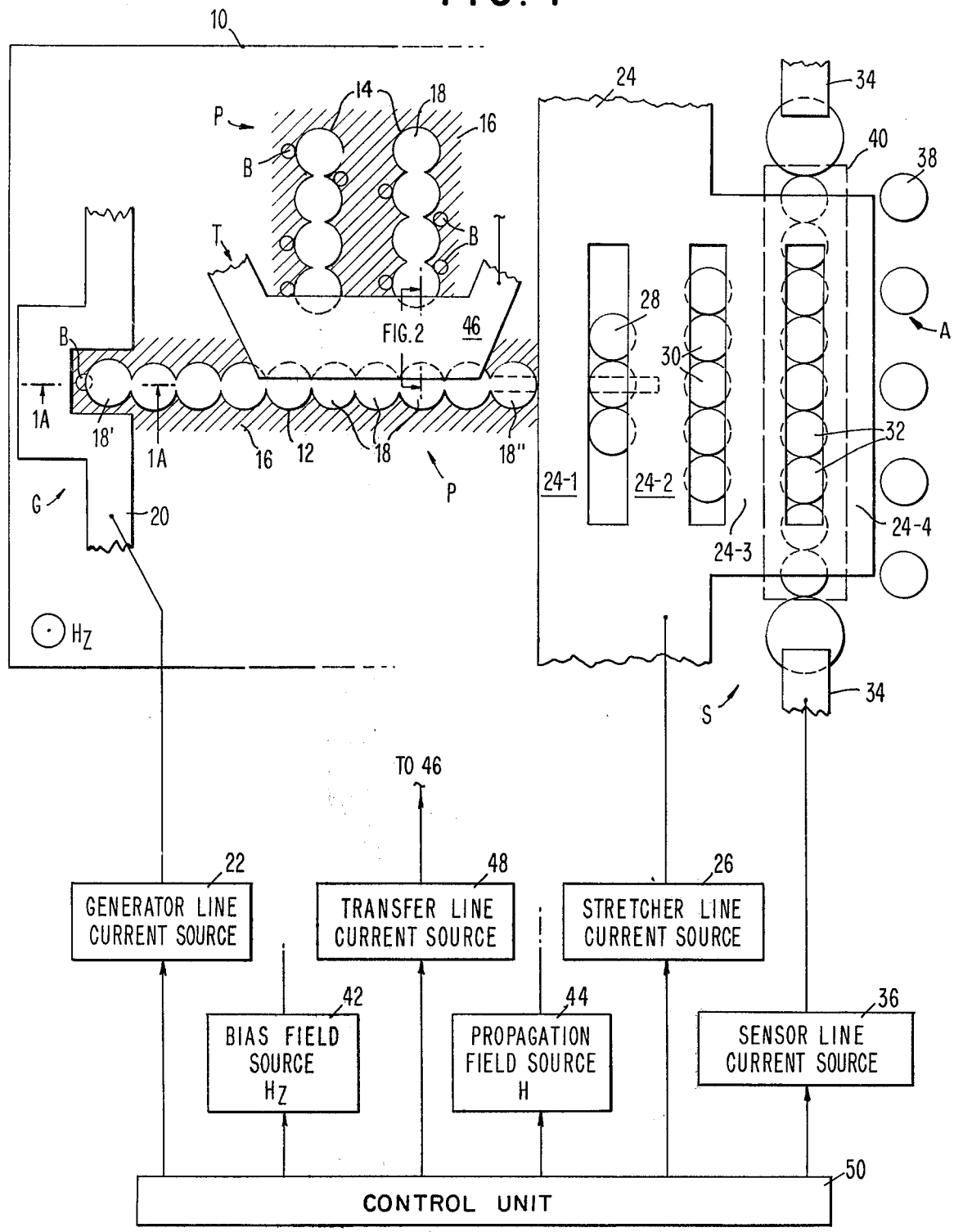
FIG. 1 is a top view of a magnetic bubble domain chip showing components used for bubble domain write, read, storage (propagation), transfer and annihilation.

Overall Magnetic Chip (FIG. 1)

FIG. 1 shows a top view of a magnetic chip which includes the functions of read, write, storage (propagation), transfer, and annihilation. As will be more apparent, components for providing these five functions will be formed by the present process where the resolution required to form the components for any of these functions is not less than 5 bubble domain diameters. In FIG. 1, a major/minor loop configuration is used for purposes of illustration only. The system used for illustrating this process is any system which incorporates a plurality of functions as would be necessary to provide a complete, high density magnetic chip. In this regard, some of the functions need not be performed on the chip in order to provide a usable chip. For instance, if bubble domains are to be returned to their storage positions after sensing, the annihilation function need not be performed.

In FIG. 1, a gapless propagation structure generally comprised of contiguous disks is utilized for movement of bubble domains. While generally circular disks are shown, the present invention is directed to all types of contiguous propagation elements for high density storage, and is not limited to the use of circular disk elements. For instance, the contiguous propagation elements could be comprised of triangular shaped elements or elements having any other geometry.

Various components are located adjacent to the magnetic medium 10 in which the bubble domains exist. This magnetic medium is comprised of a magnetic material having a uniaxial anisotropy, well-known in the art. Such materials include, for example, materials having a garnet structure. The five functional components of this system include the generator G, storage (propagation) P, transfer T, sensing S, and annihilation A. In the storage area, a major loop 12 is comprised of disk propagation elements around which the magnetic bubble domains propagate in response to reorientations of a propagation magnetic field H. The other portion of the storage area P is comprised of a plurality of minor loops 14, two of which are shown. As is well known, data enters the major loop and is transferred selectively to the minor loops 14 for storage therein. In the diagram, several magnetic bubble domains B are located about the periphery of the minor loops 14.

In the present magnetic chip, the propagation elements comprising the major and minor loops are formed by the boundaries of ion implanted regions in magnetic medium 10. That is, the interiors of the disk propagation elements are not ion implanted while the surrounding regions of these elements are ion implanted. Thus, the shaded portions 16 surrounding the abutting disk regions indicate ion implanted regions of the magnetic medium 10.

Each of the disk-shaped elements has a layer 18 thereon, which is comprised of a soft magnetic material, such as NiFe. This layer is part of the mask used to define the ion implanted regions of the magnetic medium 10 and also serves as a plating base for the remaining layer of the mask. Additionally, a portion of the layer of NiFe in the sensor region of the chip is used for detection of magnetic bubble domains. Of course, the material forming the magnetic layer can be comprised of materials other than NiFe. However, the use of permalloy is particularly advantageous since this is a magnetoresistive material that can also be used to sense magnetic bubble domains.

The generator G is comprised of a generator line 20 (conductor) through which the current can travel for creation of a magnetic field to nucleate a bubble domain B at the permalloy disk 18' located within generator line 20. Line 20 is in turn connected to generator line current source 22.

The generator G is a bubble nucleator which requires only a small nucleation current in line 20. The nucleation current required to nucleate bubbles in implanted areas of magnetic medium 10 is approximately twice as much as that required to nucleate bubbles in non-ion implanted areas of the magnetic medium. As an example, for a permalloy disk 18' having a thickness of 300 Angstroms, and a generator line 20 having a width of 25 micrometers, a nucleation current of 450 mA was used for nucleation of bubbles. For this situation, the quantity $(H_k - 4\pi M_s)$ was 750 Oe, where $H_k$ is the uniaxial anisotropy field and $M_s$ is the saturation magnetization of magnetic medium 10.

The sensor S of this magnetic chip uses a conductor together with magnetic disks to stretch a bubble domain before it is sensed, in order to enhance the output signal. Ion implantation is not required in this region of the magnetic chip. Consequently, sensing area S is comprised of a current carrying stretcher line 24 which is electrically connected to the stretcher line current source 26. The stretcher line 24 is comprised of a plurality of parallel sections 24-1, 24-2, 24-3, and 24-4. A plurality of columns of magnetic disks are provided between the various parallel sections of conductor 24. Located between sections 24-1 and 24-2 are the disks 28, while disks 30 are located between parallel conductor sections 24-2 and 24-3. Disks 32 are located between conductor sections 24-3 and 24-4. In this case, disks 32 are magnetoresistive elements (such as permalloy) which are used to sense bubble domains removed from major loop 12 and brought to the area of the sensor disks 32. These disks are in contact with one another and electrical current flows through them via the sensor line conductor 34. Conductor 34 is connected to sensor line current source 36.

Located to the right of conductor section 24-4 are magnetic disks 38 which comprise the annihilator A.

The operation of the stretcher-sensor-annihilator will now be described. Bubble domains located on the right-hand side of magnetic disk 18'' can be transferred to magnetic disks 28 by current in the stretcher line 24. Current in line 24 produces a properly directed current in parallel sections 24-1 which creates a magnetic field gradient tending to move a bubble domain from the right-hand side of disk 18'' toward the right so that it will be brought to the vicinity of magnetic disks 28. The magnetic disks 28 serve to expand the extracted domain and also move this bubble domain across the gap between conductors 24-1 and 24-2. Thus, the domain is removed from the major loop 12 and is spread out over the area of the three disks 28. Further, the disks 28 position the bubble domain properly so that it can be transferred further to the right when another current pulse is present in conductor 24. The stretcher line 24, in combination with the disks 28, and 30, move bubble domains to the right and expand these domains so that they will be brought to the vicinity of the sensor disks 32 during one rotation of the magnetic drive field H which is used to move magnetic bubble domains in medium 10. The bubble domains which are moved toward the sensor are gradually expanded so that they occupy most of the area defined by the magnetic disks 28, 30 and 32.

When the expanded bubble domain to be sensed is located beneath the magnetic disks 32, sensor line current source 36 provides a current in line 34 and through disks 32 so that the bubble domain thereat can be magnetoresistively sensed. The output of the sensor can be, for instance, a voltage signal which is then sent to a utilization circuit (not shown) for use in a conventional manner. It should be noted that the sensor disks 32 are insulated from the stretcher conductor 24 by an insulation layer 40 which is shown in phantom lines in FIG. 1. This insulation layer can be, for instance, SiO. As will be more fully appreciated with respect to the drawings illustrating the fabrication process, insulation layer 40 can be easily provided by a crude masking step, since its lateral extend is not critical. It is extent sufficient to electrically insulate disks 32 from the portions 24-3 and 24-4 of the stretcher line 24. If a magnetic stretcher structure is used for domain expansion, as is known in the art, the necessity for insulation 40 will be avoided, thereby removing a masking step.

After the expanded bubble domain has been sensed, another current pulse in conductor 24 creates a magnetic field gradient which will bring it to the annihilator disks 38. These disks are spaced apart from one another so that the elongated bubble domain transferred to disks 38 will break up and individual bubble domains will remain on the disks 38. These will in turn be imploded each time a new elongated domain is transferred from the sensor disks 32 to the annihilator disks 38. Thus, a destructive read-out is provided.

In order to stabilize the size of the magnetic bubble domains B in this system, a bias field source 42 can be provided to provide the magnetic bias field $H_z$. Any one of a number of conventional techniques, including current carrying coils, permanent magnets, and exchange coupled layers can be utilized for this component.

A propagation field source 44 provides the reorienting magnetic field H in the plane of magnetic medium 10. This field is used to move magnetic domains B along the periphery of the ion implanted region 16, in a manner well known in the art. In the usual case, field H will be a rotating magnetic field.

Bubble domains which are traveling along the major loop 12 can be transferred to the minor loops 14 by magnetic fields produced by currents in transfer line 46. Conductor 46 is connected to the transfer line current source 48. Current in line 46 produces a magnetic field gradient which moves bubble domains from the aligned disk elements in major loop 12 to the aligned disk elements in minor loops 14. One bubble domain at a time is transferred into each of the minor loops when current is in transfer line 46.

A control unit 50 provides timing signals to bias field source 42, propagation field source 44, and to the current sources 22, 26, 36 and 48. Control unit 50 thereby controls the operation of the various features of this magnetic chip so that the functions of read, write, propagate, sense and annihilate occur in the correct timed sequence. Of course, these various functions can occur simultaneously as is well known to those of skill in the art.

Figure 1A:
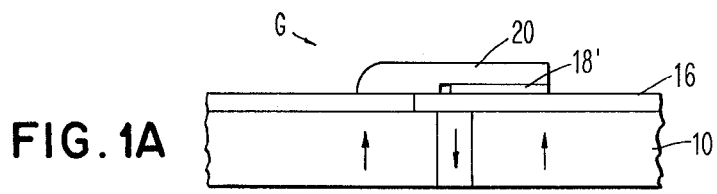
FIG. 1A is a side view of the generator portion of the structure of FIG. 1, taken along the line 1A —1A.

FIG. 1A is a side view of the generator portion G of the magnetic chip of FIG. 1, taken along the line 1A — 1A. This view illustrates the spatial layout of the ion implanted region 16, magnetic disk 18', and generator line 20 in the generator region G, and also shows the nucleated bubble domain B.

Fabrication Process (FIGS. 2A–2I)

These figures illustrate the fabrication process for providing a high density magnetic chip where the individual feature components are comprised of elements which do not have to have a resolution less than about five times the bubble domain diameter. Thus, in addition to providing a process requiring only one critical masking step, lithography limitations are not severe, which is indeed surprising when a high density, contiguous element structure is to be fabricated.

FIGS. 2A–2I illustrate the fabrication process and in particular are directed to a portion of the structure shown schematically in FIG. 1, where the line of viewing is along the line 2—2 as indicated therein. That is, FIGS. 2A–2I show the fabrication of ion implanted regions surrounding the major loop and one of the minor loops, as well as the transfer line conductor 46 used to move bubble domains between the major loop and the minor loops.

Figure 2A:
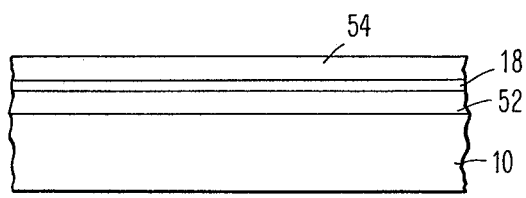
FIGS. 2A–2I show sequential steps in the fabrication of the structure of FIG. 1, where the fabrication steps are illustrated with respect to a section of FIG. 1 taken along the line 2—2.

In more detail, FIG. 2A shows a magnetic material 10, such as a garnet material, on which is deposited an insulating layer 52 having a thickness of approximately 1,000 – 4,000 Angstroms. Layer 52 can be comprised of a material such as SiO. The purpose of the insulation layer 52 is merely to protect the garnet surface during subsequent etching steps in the fabrication process. Layer 52 is therefore not always required but is shown in this illustrative embodiment.

Located on layer 52 is a magnetic layer 18, commonly comprised of NiFe which is used for the functions of bubble guiding, generation, sensing and annihilation. Layer 18 is typically 200–400 Angstroms thick, and this layer is deposited over the entire surface of the magnetic medium, as is the layer 52. Layers 52 and 18 can be deposited by known techniques, such as evaporation or sputtering. A layer 54 having a thickness of about 600 Angstroms is then deposited on magnetic layer 18. Layer 54 is comprised of a metal such as Cr—Cu and is typically formed by evaporation. The function of layer 54 is to act as a protective layer for the magnetic sensor disks 32 during the fabrication process, and also to act as a plating base for subsequent metallic depositions. In this regard, it is advantageous to use a combination of Cr and Cu, rather than using just Cr, which would not be a good plating base. Typically, layer 54 is comprised of approximately 200 Angstroms Cr and 400 Angstroms Cu. As is true with the previously deposited layers, layer 54 is deposited over the entire surface of the magnetic chip.

Figure 2B:
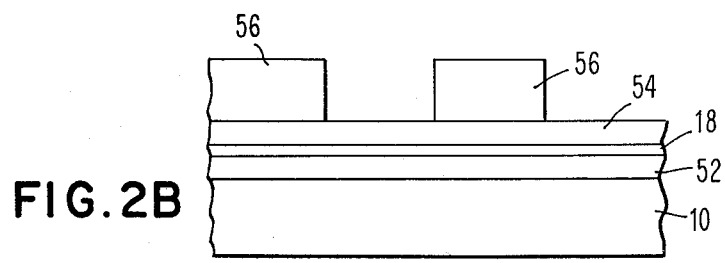
Figure 2C:
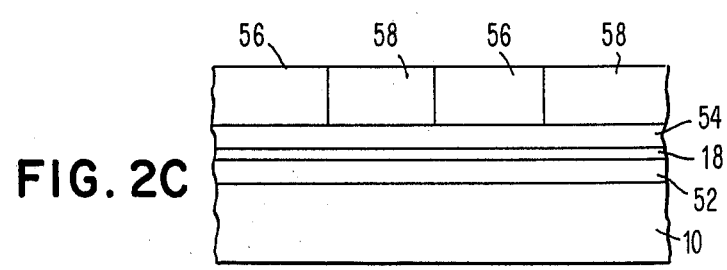

FIG. 2B shows the structure of FIG. 2A and in addition has a masking layer 56 thereon. The masking layer is comprised of a photoresist material and serves to define the propagation area P comprising the major loop and the various minor loops. Layer 56 is deposited by conventional techniques such as spinning, etc.

After the masking step illustrated by FIG. 2B, a layer 58 of material which can serve as an ion implantation mask is deposited (plated) on layer 54. Layer 58 is commonly comprised of Au which is plated to a thickness of about 2,000 Angstroms. The thickness of this layer depends upon the type of ions used for implantation and on the desired depth of implantation. These factors and their relationships are well known to those of skill in the art.

The masking layer 58 covers the disk-like elements which are located on areas which will not be ion implanted. Thus, each portion of layer 58 will protect a circular area of magnetic medium 10 from ion implantation in order to define the edges of the major and minor loops.

Figure 2D:
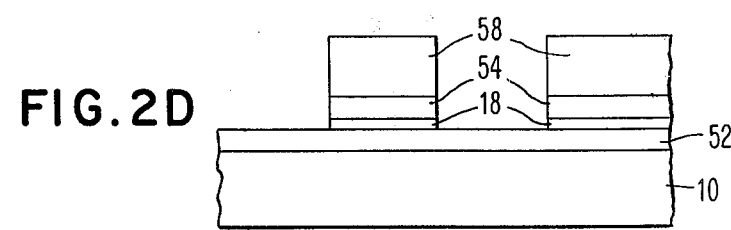

FIG. 2D shows the magnetic structure after the photoresist 56 has been removed, and after the layers 54 and 18 have been sputter etched away from the portions of the structure underlying the photoresist regions 56. This sputter etching step removes the Cr—Cu layers 54 and the NiFe layer 18 from those portions of the substrate which will be later ion implanted. As will be apparent, this means that the magnetic layer 18 will be left only in the area of the major loop and minor loops, in the area of the stretching disks 28 and 30, in the area of the sensing disks 32, and in the area of the annihilation disks 38.

Figure 2E:
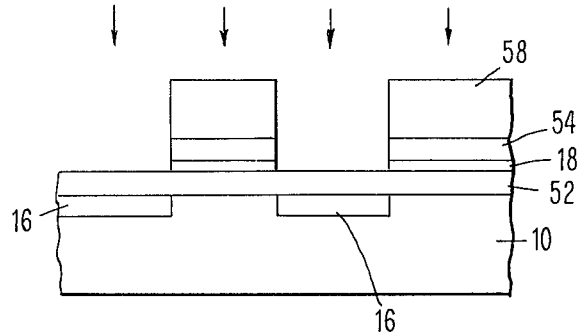

In FIG. 2E, ions, such as $H^+$, $B^+$, or $Ne^+$, impinge upon the magnetic structure to create the ion implantation regions 16 in selected regions of the magnetic material 10. The remaining portion of magnetic material 10 is protected by the masking layers comprising magnetic layer 18, Cr—Cu sensor protect layer 54 and masking layer 58. The depth of the ion implantation areas 16 is generally 10–20% of the thickness of magnetic layer 10. Of course, the implantation depth depends upon the bubble domain film 10, and upon thickness of this film. For small bubble domain films, less penetration of the ions is required and thinner magnetic layers 10 are utilized.

Figure 2F:
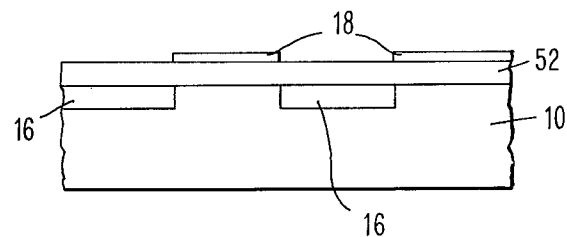

In FIG. 2F, the Au layer 58 and Cr—Cu layer 54 are chemically removed to leave the NiFe magnetic layer 18. This is a selective chemical etching step using known solutions which will remove layers 58 and 54 over the entire magnetic chip.

The next step in the process is the provision of an insulation layer 40 in the region of the sensor magnetic disk 32 in order to avoid any electrical contact between these disks and the stretcher conductor 24 which will be deposited later. This insulation layer is conveniently SiO which is deposited in a crude masking step, since alignment is not critical. The insulating layer 40 can be placed in the general sensing area except where it is desired to have the sensor line conductor 34 make electrical contact to two of the magnetic disks 32. The fabrication step directed to provision of insulating layer 40 is not shown in the drawings, since FIGS. 2A–2I are directed to the portion of the magnetic chip comprising the major loop 12, transfer line 46, and minor loop 14.

As noted previously, insulation layer 40 is not needed when a conductor expansion structure is not used. For instance, if a magnetic expansion structure of a known type is used, there would be no need for insulation 40.

Figure 2G:
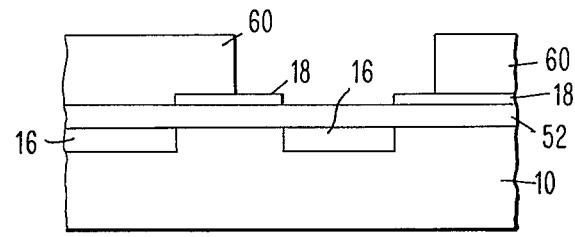

FIG. 2G illustrates the fabrication step where a masking layer 60, comprised of a suitable photoresist, is deposited on the magnetic structure to define the conductors (generator line 20, transfer line 46, stretcher line 24, and sensor line 34). This photoresist layer can be provided by conventional techniques, such as spinning.

Figure 2H:
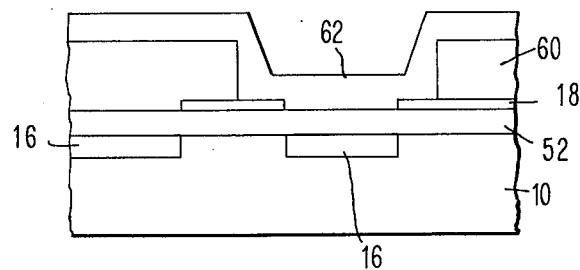

In FIG. 2H, a conductor layer 62 is deposited. This conductor layer is conveniently Au which can be evaporated to a thickness of, for instance 0.5 – 1 micron. Although all of the conductors are deposited in the same step, FIG. 2H shows that portion of the conductor layer which will be the transfer line 46.

Figure 2I:
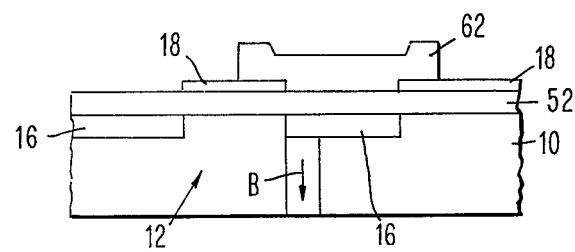

In FIG. 2I, the excess portions of the Au layer 62 are removed by conventional lift-off techniques which remove the underlying photoresist layer 60. This leaves the structure shown in FIG. 2I, where the layer 62 is the transfer line conductor 46. In this figure, a bubble domain B is shown at the edge of the major loop 12. The presence of a current in layer 62 will cause a transfer of domain B to the aligned minor loop 14.

In the fabrication process described herein, advantage was taken of the fact that the magnetic layer 18 would not adversely affect the propagation mechanism for bubble domain movement using ion implanted regions. If the presence of the magnetic elements 18 would have adversely affected bubble propagation, an additional masking step would have been required for provision of magnetic elements in the bubble domain expansion area, sensing area, annihilation area, and generation area. This masking step would be a crude masking step, since precise alignment would not be required. Again, the alignment of the conductor layer would, however, be critical.

The thickness of the magnetic layer 18 is chosen so that the mechanism for propagation of bubbles by ion implanted regions is not adversely affected by the magnetic layer 18. Additionally, the thickness of layer 18 depends upon the required output signal from the sensor area. If the magnetoresistive magnetic elements 32 are too thick, the sensor output will be reduced since less of the magnetization of the sensor would be switched by the presence of a magnetic bubble domain. Consequently, a magnetic layer 18 having a thickness between 200 and 400 Angstroms has been found to be suitable for all magnetic chips of interest using bubble domains having diameters less than 1 micron to several microns.

In the practice of this process, the resolution required to provide the components for any of the features (read, write, etc.) need not be less than five times the bubble domain diameter. Thus, the high density structure is provided with only a single critical masking step and a minimum requirement for line width resolution. This means that various fabrication techniques can be used and that the advantages of this invention do not require that only the most complicated and advanced lithography be utilized.

EXAMPLE

The structure shown generally in FIG. 1 has been formed on a variety of magnetic garnet films. For instance, garnet bubble domain films 10 having the general composition $Gd_{0.6}Y_{1.7}Yb_{0.7}Ga_1Fe_4O_{12}$ have been used in which the magnetic layer 18 is NiFe having a thickness of 200 Angstroms. The conductor layer 62 was Au having a thickness of 5,000 Angstroms. Ion implantation was achieved using $3 \times 10^{16}$ H$^+$/cm$^2$ at 75 KeV. Bubble propagation through the use of the implanted disk structure occurred with a rotating drive field H of 20 Oe.

In another example, ion implantation of the same density was done at 100 KeV to make a propagation structure with ±10% bias field margin at 30 Oe propagation field. The transfer conductor was 50 μm wide while the sensor element was 500 μm long, 25 μm wide (disk diameter), and 200 A thick. This sensor element has given a 7mV/4mA signal for a 5 μm bubble which was expanded into a 5 μm × 500 μm strip domain. Control currents ranged from ~ 100 mA for transfer to 450 mA for nucleation. An advanced device design can reduce the nucleation current sufficiently that a scaled down $10^8$ bit/in.$^2$ device should operate with current densities on the order of $2 \times 10^6$ A/cm$^2$ or less.

What has been described is a process for providing a high density magnetic bubble domain chip in which individual fabrication steps do not require highly stringent resolution. All functions necessary to provide a completely operable magnetic chip are provided by a process in which only one masking step requires a critical alignment. This is possible even though contiguous propagation elements are utilized in the present invention for maximum density structures.

As should be apparent to those of skill in the art, the device design and geometry utilized for the various feature components in the magnetic chip can be changed to suit particular design requirements and the overall system configuration can be altered extensively depending upon the user's own requirements relating to storage capacity, storage density, data rate, etc. Also, the bubble domain size can be varied to suit the designer's own specifications, which may require submicron domains or even domains of several microns diameter. Thus, any type of device and any type of system organization can be provided by the present process which utilizes ion implanted structures for domain propagation and magnetic structures for bubble domain sensing, where the provision of the magnetic structures does not adversely affect the propagation properties of the ion implanted regions and can therefore be deposited on the magnetic chip in order to serve functions during the fabrication process, in addition to their magnetic functions in the operation of the finished magnetic chip.

What is claimed is:

1. A method for fabricating magnetic bubble domain chips, comprising the steps of:
   forming a patterned magnetic layer over a substrate which includes a magnetic medium in which said bubble domains can exist, said patterned magnetic layer defining at least a sensor area and a propagation area of said bubble domain chip, said propagation area including ion implanted patterns along the edges of which said bubble domains move, said magnetic medium being ion implanted using a mask at least partially comprising said patterned magnetic layer,
   forming a patterned layer of non-magnetic electrically conductive material on specified portions of said magnetic layer using a critically aligned mask.
2. The method of claim 1, where said magnetic bubble domain medium has a garnet structure.
3. The method of claim 1, where said magnetic bubble domain medium is ion implanted in regions surrounding said patterned magnetic layer.
4. The method of claim 1, where said propagation area includes ion implanted propagation elements along which said bubble domains move in response to reorientations of a magnetic field in the plane of said magnetic madium, said propagation element being contiguous with each other.
5. The method of claim 4, where said propagation elements have generally circular edges.
6. A method for making a high-density magnetic bubble domain chip, comprising the steps of:
   depositing a first layer of metallic material on a substrate comprised of a magnetic medium in which said bubble domains can exist,
   forming a patterned layer of resist on said metallic material which exposes said first metallic layer in selected portions thereof,
   depositing a second metallic layer on said exposed portions of said first metallic layer,
   removing said resist layer,
   ion implanting said magnetic bubble domain medium to produce propagation elements therein, said ion implantation occurring in regions of said magnetic medium not covered by said second metallic layer,
   removing said second metallic layer and removing said first metallic layer except in those regions which had said second matallic layer thereon,
   forming a patterned second layer of resist which exposes at least one portion of said substrate, and
   depositing a third metallic layer onto said at least one exposed portion of said substrate.
7. The method of claim 6, in which said first layer is comprised of a layer of magnetic material and said second metallic layer is deposited by electroplating.
8. The method of claim 7, where the edges of said ion implanted regions form contiguous propagation elements for the movement of said bubble domains in said magnetic medium.
9. The method of claim 8, where said third metallic layer is comprised of an electrically conductive, non-magnetic material.
10. A method for fabricating a high-density magnetic bubble domain chip, comprising the steps of:
    forming magnetic elements on a substrate comprised of a magnetic medium in which said bubble domains can exist, said magnetic elements having a first layer of masking material thereon,
    ion implanting said bubble domain magnetic medium using said magnetic elements and said masking material as an ion implantation mask, the edges of the regions of ion implantation in said magnetic medium forming propagation elements for movement of said bubble domains in response to the reorientation of a magnetic field to produce a structure having ion implanted propagation elements,
    depositing a metallic layer on said structure through a mask which is aligned with respect to said propagation elements and with respect to said magnetic elements.
11. The method of claim 10, where said magnetic elements define a bubble domain sensor and a bubble domain generator, said ion implanted regions defining magnetic bubble domain propagation elements.

12. The method of claim 10, where said masking material is electroplated onto the magnetic material comprising said magnetic elements.

13. The method of claim 10, including the further step of removing said aligned mask after said metallic layer is deposited through said mask.

14. The method of claim 10, where said ion implanted propagation elements are contiguous with one another.

15. A method of fabricating a high-density magnetic bubble domain chip, comprising the steps of:
forming a thin layer of magnetically soft material on a substrate including a magnetic medium in which said bubble domains can be moved,
forming a layer of masking material on said thin layer of magnetically soft material,
patterning said layer of masking material and said thin layer of magnetically soft material to form an ion implantation mask having contiguous elements of said thin layer therein,
ion implanting regions of said magnetic medium surrounding said contiguous elements to form ion implanted bubble domain propagation elements which are contiguous with one another,
removing said layer of masking material from said contiguous elements of magnetically soft material to leave a structure comprising said magnetic medium having ion implanted regions therein and said contiguous elements of magnetically soft material,
masking said structure to define locations which are to receive a non-magnetic metallization layer,
depositing said metallization layer to provide electrical conductors on said magnetic chip.

16. The method of claim 15, where said structure is masked by a patterned resist layer formed on said structure and aligned therewith, said method including the further step of removing said patterned resist after said metallization layer is deposited.

17. The method of claim 16, where said layer of masking material is formed on said thin layer of magnetically soft material by electroplating.

18. The method of claim 17, where said sensor is protected during said deposition of said metallization layer.

19. The method of claim 17, where said metallization layer is comprised of Au.

20. The method of claim 17, where said thin layer of magnetically soft material is less than about 40 nm thick.

21. The method of claim 20, where said magnetic bubble domain medium has a garnet structure and said contiguous propagation elements have generally curved edges.

22. A method for fabricating a magnetic bubble domain chip, comprising the steps of:
forming magnetic elements on a substrate comprised of a magnetic medium in which said bubble domains can exist,
ion implanting said magnetic medium in areas surrounding said magnetic elements to produce ion implanted patterns along the edges of which said bubble domains will move in response to the reorientation of a magnetic field,
forming a patterned metallic layer using a mask aligned with respect to said magnetic elements and said ion implanted regions.

23. The method of claim 22, where said ion implantation step produces contiguous ion implanted regions in said magnetic bubble domain medium.

24. The method of claim 23, in which a bubble domain sensor is formed by depositing said metallic layer in overlapping relationship to at least some of said magnetic elements and providing electrical contact to other magnetic elements used to sense said bubble domains.

25. The method of claim 1, wherein said electrically conductive layer is formed in the vicinity of said sensor area to produce a bubble domain sensor comprising magnetic elements and conductors for moving said bubbles from said propagation area to said sensor area and for expanding said bubbles prior to sensing.

26. The method of claim 25, where said sensor area is formed by forming at least two rows of said magnetic elements and forming electrical conductors between said two rows and also in electrical contact with at least two magnetic elements in at least one of said two rows.

* * * * *